(12) United States Patent
Sakamoto et al.

(10) Patent No.: US 8,991,042 B2
(45) Date of Patent: Mar. 31, 2015

(54) METHOD FOR FABRICATING SEMICONDUCTOR DEVICE

(75) Inventors: Manabu Sakamoto, Yokkaichi (JP);
Tetsuya Shirasu, Kawasaki (JP); Naoki Idani, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 418 days.

(21) Appl. No.: 13/618,947

(22) Filed: Sep. 14, 2012

(65) Prior Publication Data

US 2013/0012019 A1    Jan. 10, 2013

Related U.S. Application Data

(62) Division of application No. 12/200,218, filed on Aug. 28, 2008, now Pat. No. 8,286,344.

(30) Foreign Application Priority Data

Aug. 31, 2007   (JP) ................ 2007-226200

(51) Int. Cl.
*H05K 3/02* (2006.01)
*H01L 21/321* (2006.01)
*B24B 37/04* (2012.01)
(Continued)

(52) U.S. Cl.
CPC .......... *H01L 21/3212* (2013.01); *B24B 37/042* (2013.01); *B24B 53/017* (2013.01); *B24B 53/12* (2013.01)
USPC ............ 29/847; 29/846; 29/852; 29/853; 156/345.12; 205/157; 216/13; 257/774; 438/633; 438/689; 451/37; 451/443; 51/307; 51/293

(58) Field of Classification Search
USPC ................... 29/846, 847, 852, 853; 156/345.12–345.14; 205/157; 216/13; 257/774; 438/633, 689–693; 451/37, 451/41, 443; 51/307, 308, 309, 293
See application file for complete search history.

(56) References Cited

U.S. PATENT DOCUMENTS 6,241,581 B1 *  6/2001  Miyashita et al. ............ 451/41
6,306,025 B1 * 10/2001  Torii ............................ 451/443
(Continued)

FOREIGN PATENT DOCUMENTS

JP    10-303152 A    11/1998
JP    2002-134505 A   5/2002
(Continued)

OTHER PUBLICATIONS

Japanese Office Action dated Jul. 17, 2012, issued in corresponding Japanese Patent Application No. 2007-226200, with Partial Translation (7 pages).

*Primary Examiner* — Peter DungBa Vo
*Assistant Examiner* — Jeffrey T Carley
(74) *Attorney, Agent, or Firm* — Westerman, Hattori, Daniels & Adrian, LLP

(57) ABSTRACT

A method for fabricating a semiconductor device includes (a) depositing an insulating film on a semiconductor substrate; (b) forming a recess in the insulating film; (c) depositing a conductive film on the insulating film while filling the recess with the conductive film; and (d) polishing the conductive film. Step (d) includes a first polishing substep of using a first polisher pad conditioned with a first dresser and a second polishing substep of using a second polisher pad conditioned with a second dresser different from the first dresser.

4 Claims, 15 Drawing Sheets

(51) Int. Cl.
*B24B 53/017* (2012.01)
*B24B 53/12* (2006.01)

(56) References Cited

U.S. PATENT DOCUMENTS

| | | | |
|---|---|---|---|
| 6,379,230 B1 * | 4/2002 | Hayashi et al. | 451/292 |
| 6,436,834 B1 * | 8/2002 | Lee et al. | 438/693 |
| 6,488,573 B1 * | 12/2002 | Kobayashi et al. | 451/285 |
| 6,524,523 B1 * | 2/2003 | Jeng et al. | 419/8 |
| 6,755,720 B1 * | 6/2004 | Ishizaki et al. | 451/28 |

FOREIGN PATENT DOCUMENTS

| | | | | |
|---|---|---|---|---|
| JP | 2004-128112 A | | 4/2004 | |
| JP | 2004128112 A | * | 4/2004 | H01L 21/304 |
| JP | 2006-253717 A | | 9/2006 | |

\* cited by examiner

METHOD FOR FABRICATING SEMICONDUCTOR DEVICE

CROSS-REFERENCE TO RELATED APPLICATION

This application is a divisional of U.S. application Ser. No. 12/200,218, filed Aug. 28, 2008, still pending, and which claims the benefit of priority from the prior Japanese Patent Application No. 2007-226200 filed on Aug. 31, 2007, the entire contents of which are incorporated herein by reference.

BACKGROUND OF THE INVENTION

1. Field

The present invention relates to methods for fabricating semiconductor devices. In particular, it relates to a method for fabricating a semiconductor device, including a step of planarizing a surface by chemical mechanical polishing.

2. Description of Related Art

Recently, in manufacturing a semiconductor integrated circuit device having a multilayer structure, the focal depth for exposure in a photolithographic step is decreasing as exposure patterns become finer. In order to form an image of a transfer pattern on the entire surface of a substrate, the flatness of the substrate surface needs to be increased. A chemical mechanical polishing (CMP) process is introduced to increase the flatness of the substrate surface.

Japanese Laid-open Patent Application Publication No. 2004-128112 describes a CMP apparatus for planarizing a substrate surface. A typical CMP apparatus is equipped with a plurality of polish tables. A polisher pad formed of, for example, polyurethane foam is attached to each polish table. A semiconductor substrate is polished while being held by a polish head and pressed against a polisher pad. Each polish table is equipped with a dresser for conditioning the polisher pad. A new polisher pad placed on a polish table is subjected to conditioning before actual polishing. Conditioning is also conducted after completion of polishing of one wafer before polishing of a next wafer. Conditioning may be conducted during polishing.

In a typical planarization step by CMP, a surface in which patterned metal films and insulating films are exposed is polished to conduct planarization. In order not to generate differences in level between the metal film surfaces and the insulating film surfaces, the ratio of the polish rate of the metal films to the polish rate of the insulating films needs to be controlled to an appropriate value.

In the case where metal wiring is formed by a damascene process, overpolishing is sometimes conducted to prevent the metal films from remaining on the insulating films. As a result of overpolishing, surface layer portions of the metal films filling recesses are excessively polished, thereby rendering the upper surfaces of the metal films to be lower than the upper surfaces of the insulating films and generating dents. These dents that occur in the metal film surfaces are called "dishing".

In planarizing the surface after dishing is formed therein, the ratio of the metal film polish rate to the insulating film polish rate needs to be controlled at an appropriate level in accordance with the depth of the dishing.

SUMMARY

According to an aspect of an embodiment, a method for fabricating a semiconductor device includes (a) depositing an insulating film on a semiconductor substrate; (b) forming a recess in the insulating film; (c) depositing a conductive film on the insulating film while filling the recess with the conductive film; and (d) polishing the conductive film. Step (d) includes a first polishing substep of using a first polisher pad conditioned with a first dresser and a second polishing substep of using a second polisher pad conditioned with a second dresser different from the first dresser.

DETAILED DESCRIPTION

Figure 1:
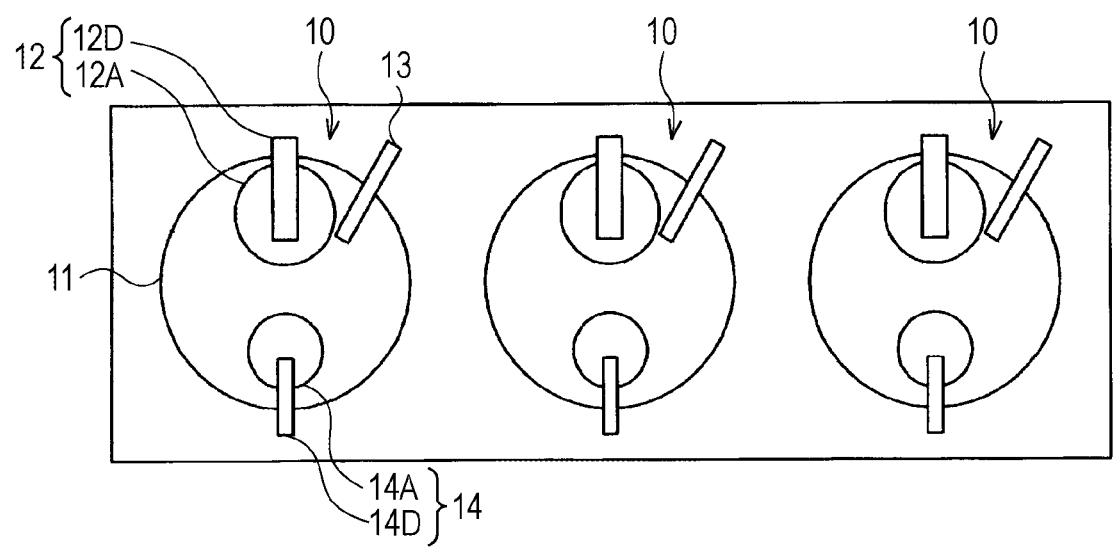
FIG. 1 is a schematic plan view of a chemical mechanical polishing apparatus used in an example.

FIG. 1 is a schematic plan view of a CMP apparatus of Example. One CMP apparatus includes a plurality of, e.g., three, polishing units 10. Each polishing unit 10 includes a polish table 11, a polish head 12, a slurry feed pipe 13, and a dresser 14. The polish head 12 includes a holding mechanism 12A for holding a wafer, which is a subject to be polished, and a swing arm 12D. The holding mechanism 12A holds the wafer and presses a surface of the wafer to be polished against the upper surface (hereinafter referred to as "polishing surface") of the polish table 11. The swing arm 12D moves the holding mechanism 12A along a plane parallel to the polishing surface of the polish table 11.

A slurry is dropped onto the polishing surface of the polish table 11 through the slurry feed pipe 13. The dresser 14 includes an abrasive grain plate 14A and a swing arm 14D. A surface of the abrasive grain plate 14A in which the abrasive grains are affixed is brought into contact with the polishing surface of the polish table 11 to conduct conditioning of the polishing surface. The swing arm 14D moves the abrasive grain plate 14A in the radial direction of the polish table 11.

Figure 2:
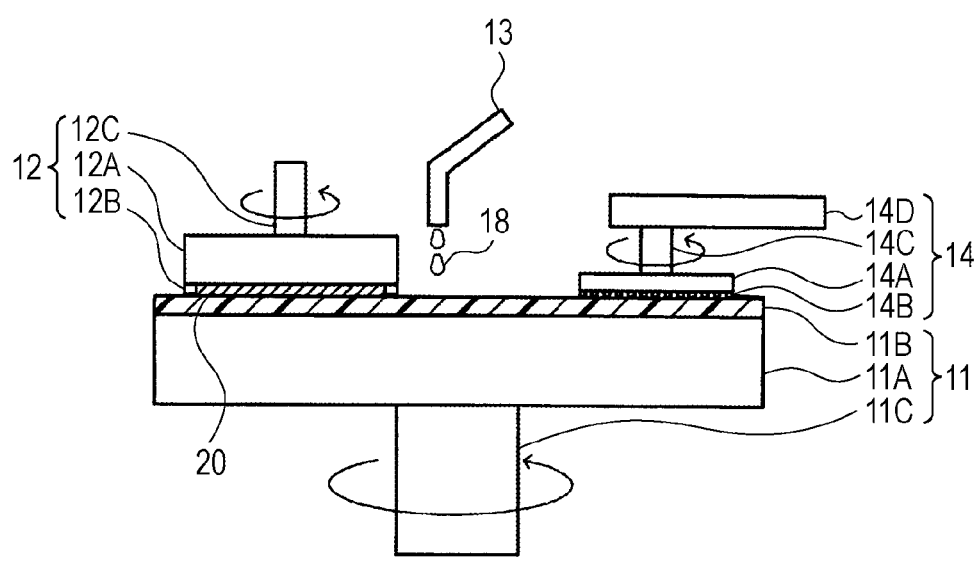
FIG. 2 is a schematic cross-sectional view of one polishing unit.

FIG. 2 is a schematic cross-sectional view of the polishing unit 10. The polish table 11 includes a rotary platen 11A, a rotating shaft 11C, and a polisher pad 11B. The polisher pad 11B is fixed on the upper surface of the rotary platen 11A. The rotary platen 11A is supported on the rotating shaft 11C and rotates about the rotating shaft 11C. The polisher pad 11B is formed of, e.g., foamed polyurethane.

The polish head 12 includes the holding mechanism 12A, a retainer ring 12B, and a rotating shaft 12C. A wafer 20 is held under the holding mechanism 12A and pressed onto the surface of the polisher pad 11B. The retainer ring 12B surrounds the wafer 20 held by the holding mechanism 12A and restrains the wafer 20 to prevent the wafer 20 from falling off the holding mechanism 12A. The holding mechanism 12A is supported by the rotating shaft 12C and rotates about the rotating shaft 12C.

A slurry 18 is dropped onto the surface of the polisher pad 11B from the slurry feed pipe 13. An appropriate material is selected as the slurry 18 according to the material to be polished. The slurry 18 is, for example, an alkaline solution containing $SiO_2$ particles.

The dresser 14 includes the abrasive grain plate 14A made of stainless steel, abrasive grains 14B, a rotating shaft 14C, and the swing arm 14D. The abrasive grain plate 14A is arranged to oppose the polisher pad 11B, and many abrasive grain 14B are fixed on this opposing surface. For example, diamond particles are used as the abrasive grain 14B. The abrasive grains 14B are fixed on the abrasive grain plate 14A by nickel plating, brazing, or the like. The rotating shaft 14C rotatably supports the abrasive grain plate 14A. The rotating shaft 14C is supported at an end of the swing arm 14D.

The surface condition of the polisher pad 11B can be adjusted (conditioned) by pressing the rotating abrasive grain plate 14A onto the polisher pad 11B. A new polisher pad 11B after being fixed on the platen 11A is subjected to conditioning for about 10 to about 30 minutes. The amount of time for conditioning performed after polishing of one wafer before polishing a next wafer is, for example, 10 to 60 seconds. The force of pressing the dresser 14 onto the polisher pad 11B during conditioning is, for example, 2 to 8 kg-force. During conditioning, the dresser 14 is reciprocated in the radial direction of the polisher pad 11B for about 5 to 20 times per minute. The rotation speed of the abrasive grain plate 14A is about 100 to 200 rpm.

An experiment for evaluating the ratio of the metal film polish rate to the insulating film polish rate was conducted by polishing wafers with a plurality of polisher pads which had been subjected to conditioning using dressers 14 having abrasive grains 14B with a different average size, arrangement density, abrasive grain morphology, or distribution form. The results of this evaluation experiment are described below.

A sample of a silicon substrate on which a silicon oxide film was formed by chemical vapor deposition (CVD) and a sample of a silicon substrate on which a copper film was formed by physical vapor deposition (PVD) and plating were prepared. The silicon oxide film and the copper film of these samples were polished under the conditions described below to calculate the polish rate ratio. The same slurry was used for polishing.

Figure 3:
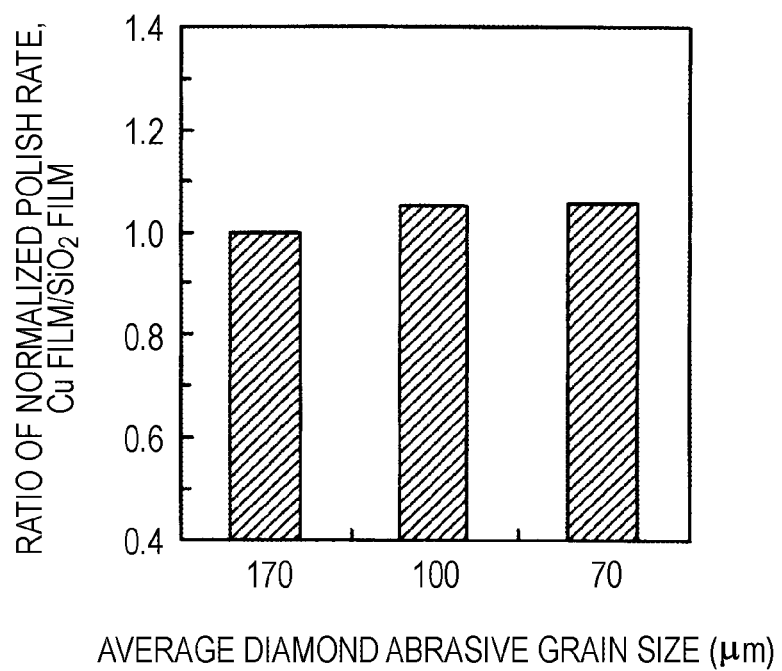
FIG. 3 is a graph showing ratios of a polish rate of a copper film to a polish rate of a silicon oxide film when the films are polished with polisher pads conditioned with dressers having different average diamond abrasive grain sizes.

Polish head load: 280 $g/cm^2$
Polish head rotation speed: 50 rpm
Polish table rotation speed: 60 rpm
Slurry feed amount: 0.2 L/min
Polisher pad: IC1010 produced by Rodel-Nitta Corporation FIG. 3 shows the polish rate ratios of the case in which polishing is conducted using three separate polisher pads conditioned with dressers having abrasive grains 14B of different average sizes. The vertical axis indicates the ratio of the polish rate of the copper film to the polish rate of the silicon oxide film. The ratio is normalized so that the polish rate ratio when a polisher pad conditioned with a dresser having an average abrasive grain size of 170 μm is used is 1. The arrangement density of the abrasive grains 14B was 8.0 $mm^{-2}$ and the ratio of cuboctahedron abrasive grains was 90% or less in all dressers. The abrasive grains were arranged at latticed points of a lattice pattern. The graph shows that the polish rate ratio increases as the average abrasive grain size decreases within the average abrasive grain size range of 70 μm to 170 μm.

Figure 4:
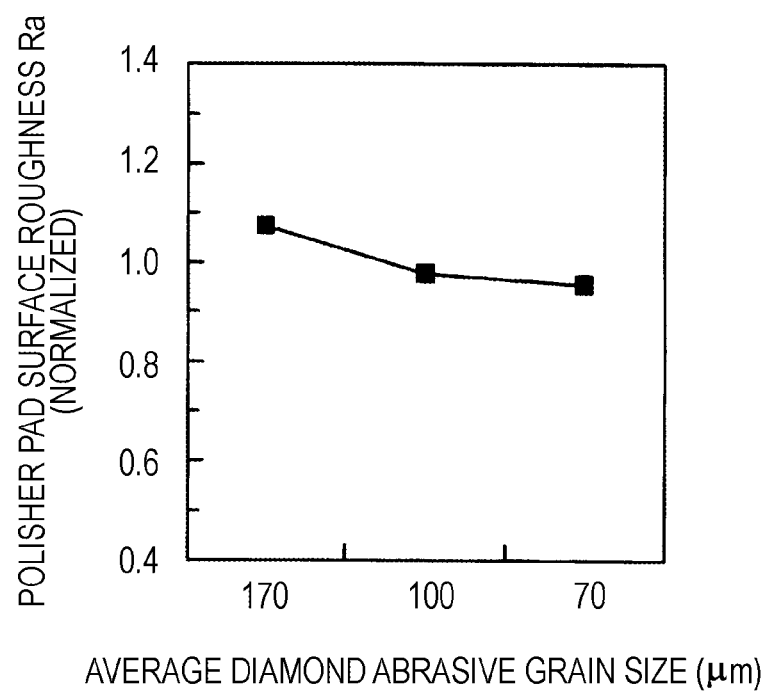
FIG. 4 is a graph showing the surface roughness of polisher pads conditioned with dressers having different average diamond abrasive grain sizes.

FIG. 4 shows the surface roughness Ra of each of the three separate polisher pads 11B conditioned with the dressers described above. The vertical axis indicates the surface roughness Ra of the polisher pad, normalized so that the surface roughness Ra of the polisher pad conditioned with a dresser having an abrasive grain size of 100 μm is 1. The surface roughness Ra is an arithmetic mean roughness, which is an average distance between the position of the pad surface and the pad surface average height. The graph shows that, when the average abrasive grain size is within the range of 70 μm to 170 μm, the surface of the polisher pad becomes rougher as the average abrasive grain size increases.

As shown in FIG. 3, the polish rate ratio is dependent on the average abrasive grain size of the dresser 14 that conditions the polisher pad. This is presumably because of differences in surface roughness of the polisher pads 11B as shown in FIG. 4.

Figure 5:
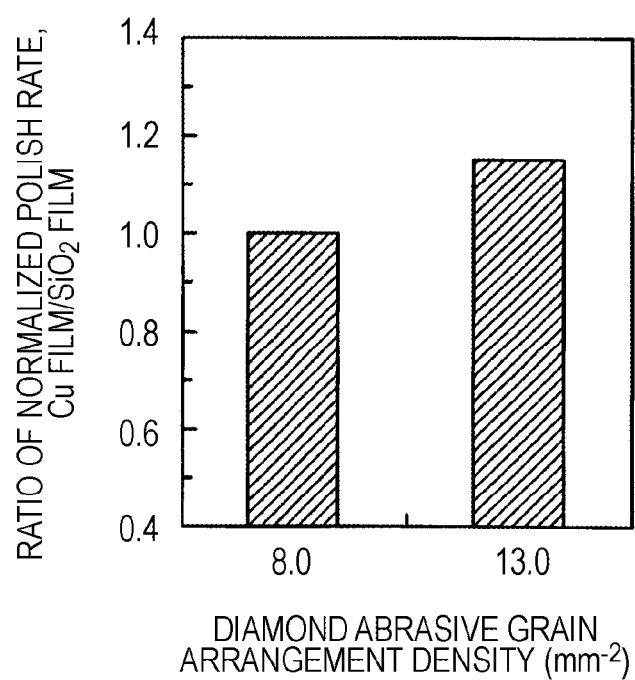
FIG. 5 is a graph showing ratios of a polish rate of a copper film to a polish rate of a silicon oxide film when the films are polished with polisher pads conditioned with dressers having different arrangement densities of diamond abrasive grains.

FIG. 5 shows the polish rate ratios when polishing is conducted by using two separate polisher pads conditioned with dressers having diamond abrasive grains 14B with different arrangement densities. The vertical axis indicates the ratio of the polish rate of the copper film to the polish rate of the silicon oxide film. The ratio is normalized so that the polish rate ratio when the polisher pad conditioned with a dresser having an abrasive grain arrangement density of 8.0 $mm^{-2}$ is used is 1. For all dressers, the average size of the abrasive grains 14B was 140 μm, the ratio of cuboctahedron abrasive grains was 90% or less, and the abrasive grains were arranged at lattice points in as lattice pattern. The graph shows that, in the arrangement density range of 8 $mm^{-2}$ to 13 $mm^{-2}$, the polish rate ratio increases with the arrangement density.

Figure 6:
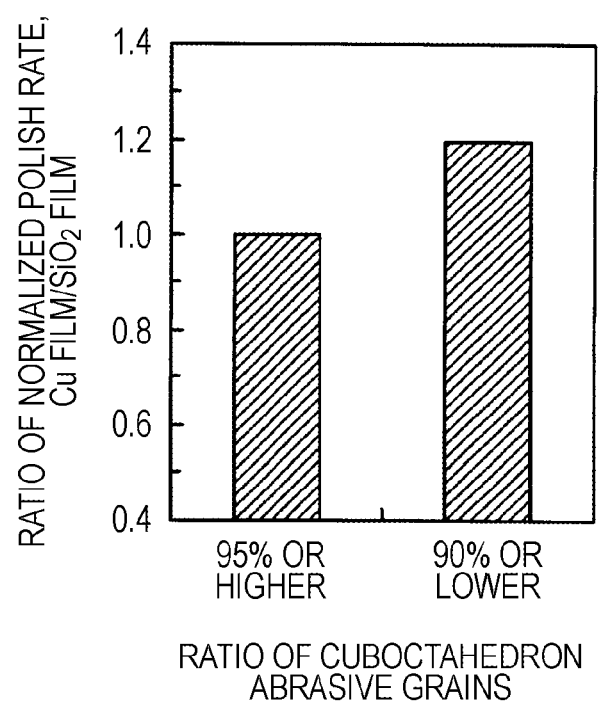
FIG. 6 is a graph showing ratios of a polish rate of a copper film to a polish rate of a silicon oxide film when the films are polished with polisher pads conditioned with dressers having different ratios of cuboctahedron diamond abrasive grains.

FIG. 6 shows the polish rate ratios when polishing is conducted by using polisher pads conditioned with dressers having different ratios of cuboctahedron diamond abrasive grains. The vertical axis indicates the ratio of the polish rate of the copper film to the polish rate of the silicon oxide film. The ratio is normalized so that the polish rate ratio when a polisher pad conditioned with a dresser in which the ratio of cuboctahedron abrasive grains is 95% or more is used is 1. For all dressers, the average size of the abrasive grains 14B was 140 μm, the abrasive grain arrangement density was 13.0 $mm^{-2}$, and the abrasive grains were arranged at lattice points in a lattice pattern. The graph shows that the polish rate ratio increases as the ratio of the cuboctahedron abrasive grains decreases.

Figure 7:
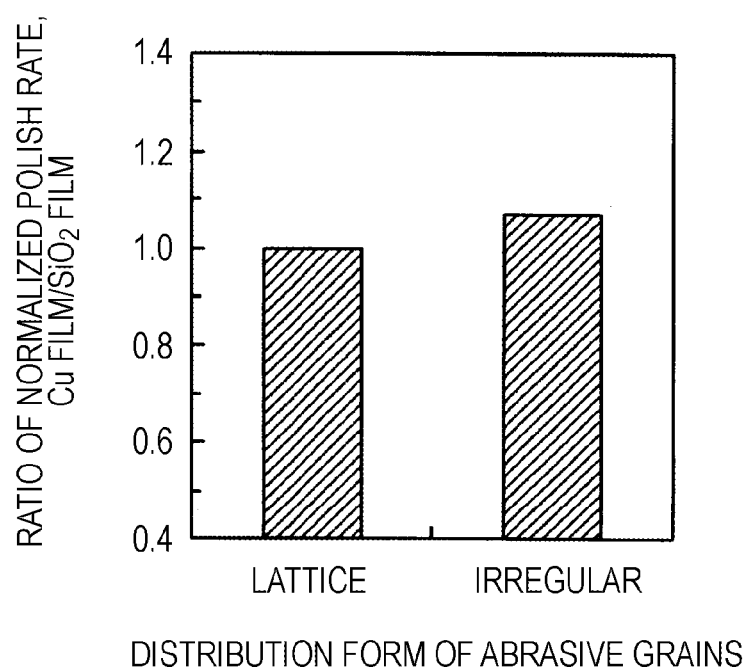
FIG. 7 is a graph showing ratios of a polish rate of a copper film to a polish rate of a silicon oxide film when the films are polished with polisher pads conditioned with dressers having different distribution forms of diamond abrasive grains.

FIG. 7 shows a polish rate ratio when a polisher pad conditioned with a dresser having abrasive grains 14B regularly arranged at intersections (lattice points) of a square lattice is used and a polish rate ratio when a polisher pad conditioned with a dresser having abrasive grains 14B irregularly arranged is used. The vertical axis indicates the ratio of the polish rate of the copper film to the polish rate of the silicon oxide film. The ratio is normalized so that the polish rate ratio when the polisher pad conditioned with the dresser with abrasive grains regularly distributed at lattice points of a square lattice is used is 1. For all dressers, the average size of the abrasive grains 14B was 100 μm, the abrasive grain arrangement density was 8.0 mm$^{-2}$, and the ratio of cuboctahedron abrasive grains was 90% or less. The graph shows that the polish rate ratio is higher when the abrasive grains are distributed irregularly.

As shown in FIGS. 5 to 7, the polish rate ratio is dependent on the specifications of the dresser used in conditioning. As with the case shown in FIG. 4, this is presumably because of the differences in surface roughness of the polisher pads 11B.

The evaluation experiment conducted by the inventors described above shows that the ratio of the polish rate of the copper film to the polish rate of the silicon oxide film differs when the specifications of the dresser used for conditioning are different, to be more specific, when at least one of the average abrasive grain size, the abrasive grain arrangement density, the ratio of cuboctahedron abrasive grains, and the distribution form of the abrasive grain is different. Although the polish rate ratio of the copper film to the silicon oxide film was calculated in the aforementioned evaluation experiment, it can be assumed that the ratio of the polish rate of a metal film to the polish rate of an insulating film composed of a material other than silicon oxide is dependent on the specifications of the dresser. The combination is also not limited to the insulating film and the metal film. It can be assumed that, in general, the polish rate ratio between any two materials is dependent on the specifications of the dresser. For example, with a combination of insulating films such as a silicon oxide film and a silicon nitride film or with a combination of metal films such as a copper film and a titanium film is concerned, the polish rate ratio is also considered to be dependent on the specifications of the dresser.

A method for fabricating a semiconductor device according to a first embodiment will now be described with reference to FIGS. 8A to 8G.

Figure 8A:
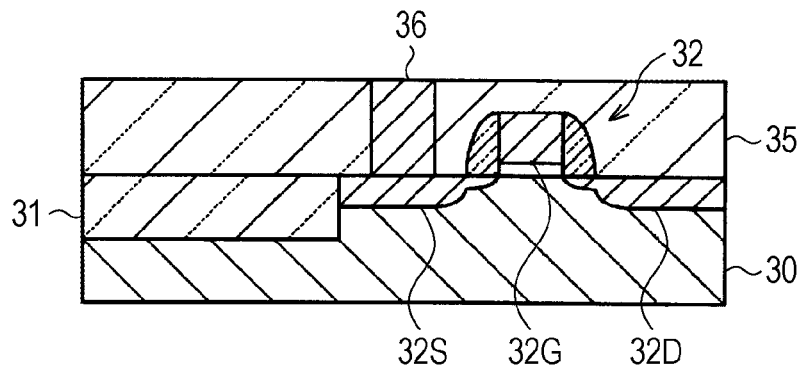
FIGS. 8A to 8G are cross-sectional views of an element illustrating a method for fabricating a semiconductor device according to a first embodiment.

As shown in FIG. 8A, an element isolation insulating film 31 is formed on the surface of a semiconductor substrate 30 composed of silicon. A MOS-FET 32 is formed in an active region surrounded by the element isolation insulating film 31. The MOS-FET 32 includes a source 32S, a drain 32D, a gate electrode 32G, and other associated components.

An interlayer insulating film 35 composed of silicon oxide or the like is formed over the semiconductor substrate 30 by covering the MOS-FET 32. A via hole is formed in the interlayer insulating film 35, and a conduction plug 36 fills the via hole. The conduction plug 36 maybe connected to the source 32S of the MOS-FET 32.

Figure 8B:
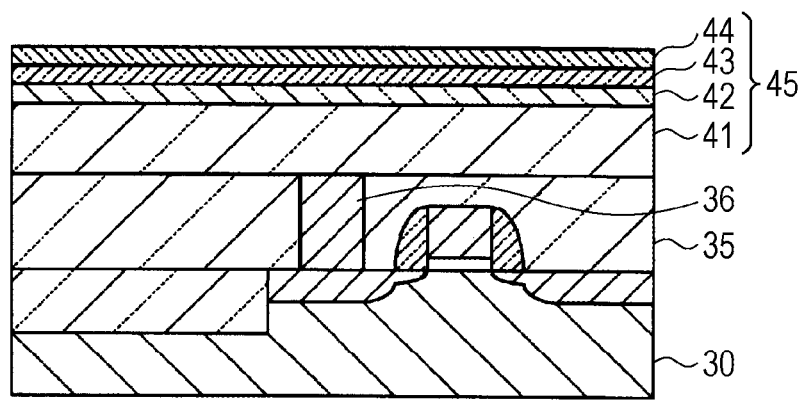

As shown in FIG. 8B, an insulating film 45 composed of insulating materials is deposited on the interlayer insulating film 35. The insulating film 45 has a four-layer structure in which an interlayer insulating film 41, a cap film 42, a first sacrificial film 43, and a second sacrificial film 44 are stacked in that order from the bottom. The cap film 42 is composed of an insulating material different from that of the interlayer insulating film 41. The first sacrificial film 43 is composed of an insulating material different from those of the interlayer insulating film 41 and the cap film 42. The second sacrificial film 44 is composed of an insulating material different from that of the first sacrificial film 43.

The interlayer insulating film 41 is composed of a low-k material such as porous silica. The cap film 42, the first sacrificial film 43, and the second sacrificial film 44 are, for example, each composed of silicon oxide ($SiO_2$), silicon oxycarbide (SiOC), silicon carbide (SiC), silicon nitride (SiN), silicon oxynitride (SiON), or the like. For example, the cap film 42, the first sacrificial film 43, and the second sacrificial film 44 are respectively composed of SiN, $SiO_2$, and SiN.

Figure 8C:
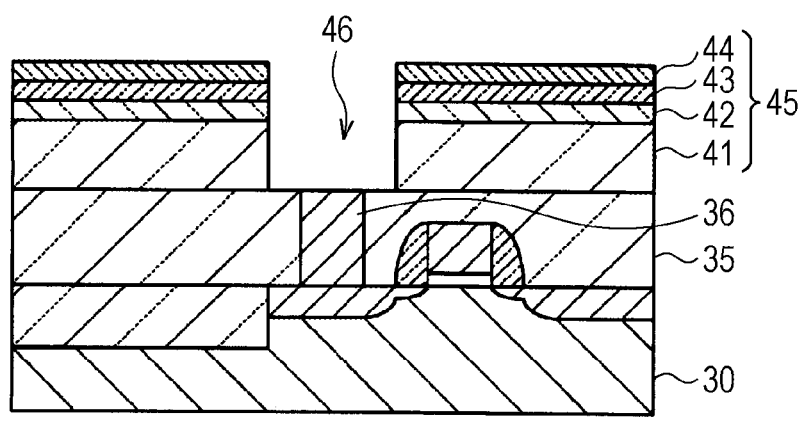

As shown in FIG. 8C, a recess 46 serving as a groove for wiring is formed in the insulating film 45. The first sacrificial film 43 and the second sacrificial film 44 are used as antireflection films during lithography or as hard masks during etching of the interlayer insulating film 41, for example. In the case where a single damascene method is employed, the recess 46 reaches the bottom surface of the interlayer insulating film 41. In the case where a double damascene method is employed, the recess 46 reaches some position in the interlayer insulating film 41 in the thickness direction other than the bottom. In all cases, the recess 46 reaches a position deeper than the bottom surface of the first sacrificial film 43.

Figure 8D:
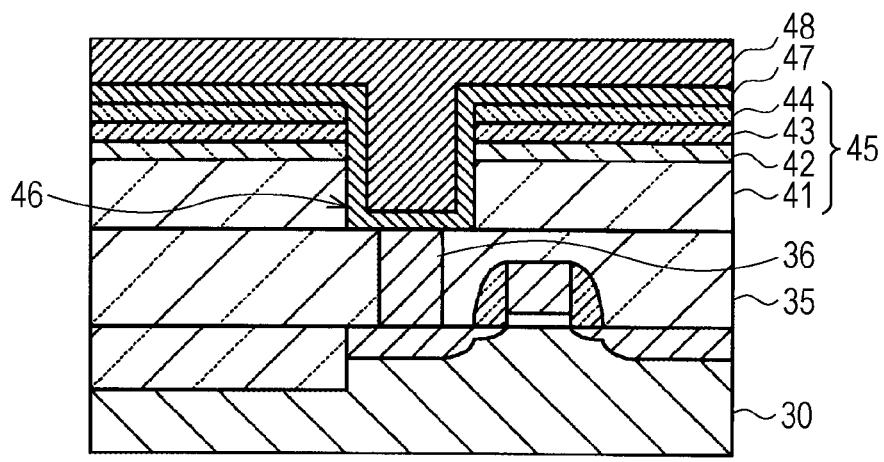

As shown in FIG. 8D, the inner surface of the recess 46 and the upper surface of the second sacrificial film 44 are covered with a barrier metal film 47. The barrier metal film 47 is composed of, for example, Ta, TiN, Ti, or the like. The barrier metal film 47 may have a multilayer structure including metal films composed of Ta, TiN, Ti, and the like. As a conductive film 48 is deposited on the barrier metal film 47, the interior of the recess 46 is filled with the conductive film 48. The conductive film 48 is composed of, for example, copper or an alloy containing copper as the main component. The conductive film 48 can be deposited by electrolytic plating of copper after formation of a copper seed film by sputtering or the like.

Figure 8E:
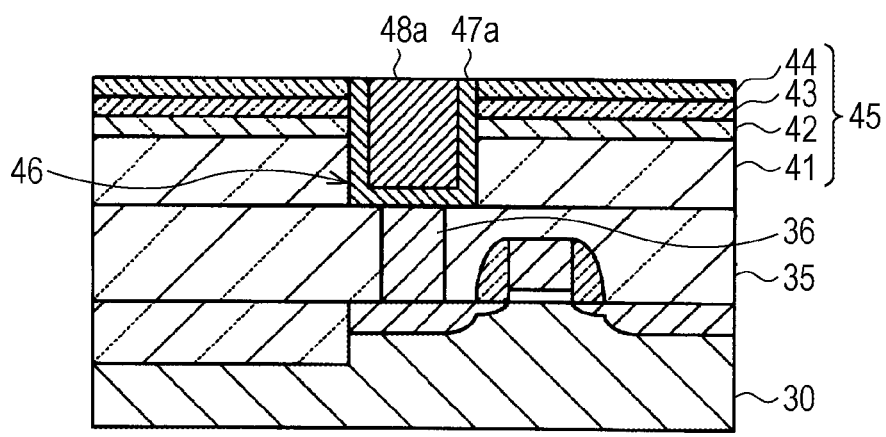

As shown in FIG. 8E, the conductive film 48 and the barrier metal film 47 above the upper surface of the insulating film 45 are removed by CMP. As a result, a barrier metal film 47a and a conductive film 48a remain in the recess 46. The second sacrificial film 44 and a surface layer portion of the conductive film 48a remaining in the recess 46 are then removed by CMP.

Figure 8F:
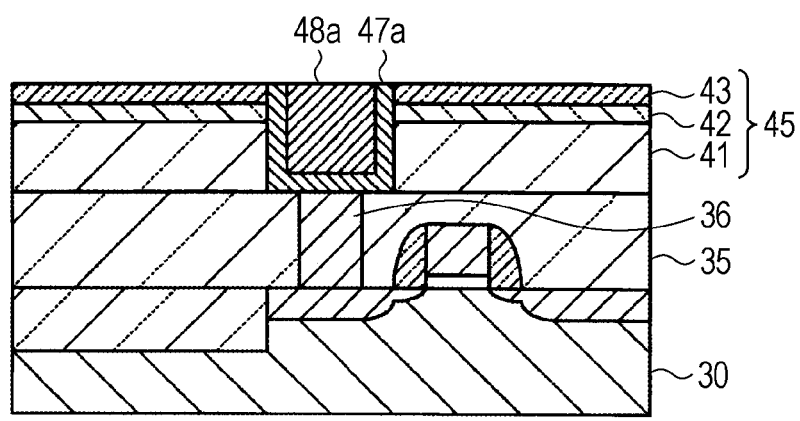

As shown in FIG. 8F, the first sacrificial film 43 is exposed. The first sacrificial film 43 and a surface layer portion of the conductive film 48a remaining in the recess 46 are then removed by CMP.

Figure 8G:
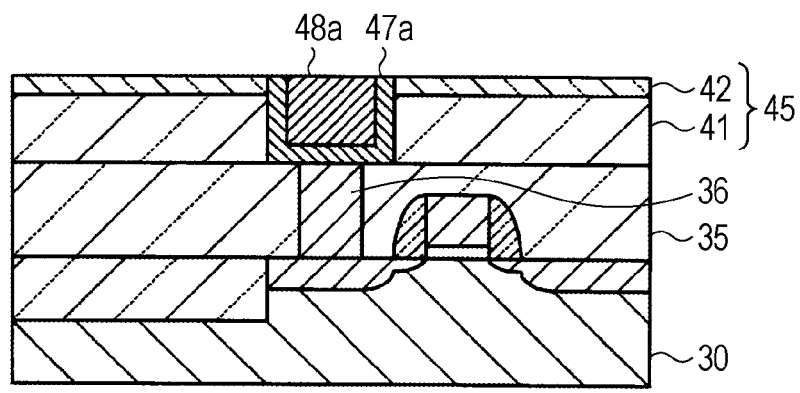

As a result, the cap film 42 is exposed as shown in FIG. 8G.

The CMP steps taken in FIGS. 8E to 8G are performed by using polisher pads 11B conditioned with dressers 14 as shown in FIGS. 1 and 2. The slurry used was the same. The dressers 14 that condition the polisher pads 11B have specifications different from one another from one CMP step to another. For example, the three polishing units 10 shown in FIG. 1 are equipped with dressers 14 having specifications different from one another. By choosing an appropriate polishing unit 10 for polishing, a suitable polisher pad can be selected from a plurality of polisher pads conditioned with dressers with different specification.

In the step of polishing the conductive film 48 shown in FIG. 8D, it is preferable to adopt a condition so that the polish rate of the conductive film 48 is larger than the polish rate of the second sacrificial film 44. In the step of polishing the second sacrificial film 44 and the surface layer portion of the conductive film 48a shown in FIG. 8E, it is preferable to adopt a condition so that the upper surface of the first sacrificial film 43 and the upper surface of the conductive film 48a shown in FIG. 8F are as flat as possible. In the step of polishing the first sacrificial film 43 and the surface layer portion of the conductive film 48a shown in FIG. 8F, it is preferable to adopt a condition so that the upper surface of the cap film 42 and the upper surface of the conductive film 48a shown in FIG. 8G are as flat as possible.

The aforementioned conditions can be selected more freely by using polisher pads conditioned with dressers 14 having specifications suitable for the respective CMP steps.

In polishing the second sacrificial film 44 shown in FIG. 8E, a polisher pad conditioned with a first dresser is used. In polishing the first sacrificial film 43 shown in FIG. 8F, a polisher pad conditioned with a second dresser having specifications different from those of the first dresser is used.

It is preferable to select a polisher pad so that the ratio of the polish rate of the conductive film 48 to the polish rate of the surface layer portion (second sacrificial film 44) of the insulating film 45 when a polisher pad conditioned with the first dresser is used is larger than when a polisher pad conditioned with the second dresser is used. In this manner, the conductive film 48 can be polished more effectively.

In order to increase flatness, it is preferable to select a polisher pad so that the ratio of the polish rate of the conductive film 48 to the polish rate of the second sacrificial film 44 when a polisher pad conditioned with a first dresser is used is closer to 1 than when a polisher pad conditioned with the second dresser is used, so that the ratio of the polish rate of the conductive film 48 to the polish rate of the first sacrificial film 43 when a polisher pad conditioned with the second dresser is used is closer to 1 than when a polisher pad conditioned with the first dresser is used.

In the case where the surface of the conductive film 48a is projected from the surface of the second sacrificial film 44 immediately before starting polishing of the second sacrificial film 44, polishing is preferably conducted under a condition so that the ratio of the polish rate of the conductive film 48a to the polish rate of the second sacrificial film 44 is larger. In contrast, in the case where the surface of the conductive film 48a is below the level of the surface of the second sacrificial film 44 immediately before starting polishing of the second sacrificial film 44, it is preferable to conduct polishing under a condition so that the ratio of the polish rate of the conductive film 48a to the polish rate of the second sacrificial film 44 is smaller. These preferable ratios of the polish rates equally apply to cases in which the first sacrificial film 43 and the surface layer portion of the conductive film 48a are polished.

A method for fabricating a semiconductor device according to a second embodiment will now be described with reference to FIGS. 9A to 9F.

Figure 9A:
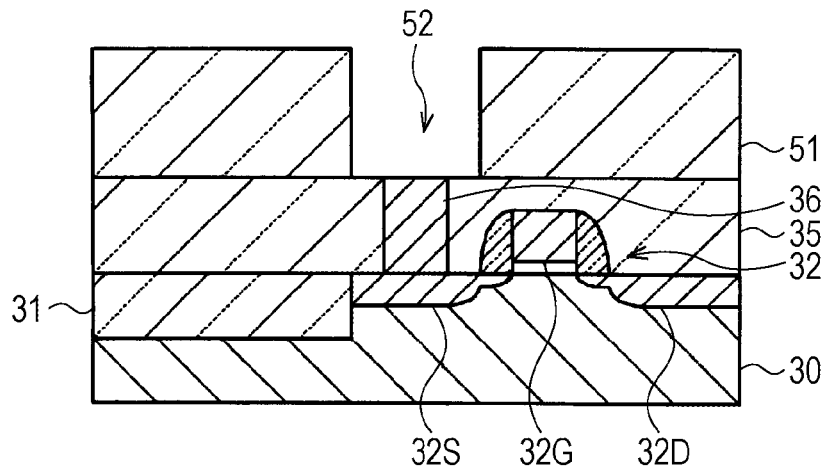
FIGS. 9A to 9F are cross-sectional views of an element illustrating a method for fabricating a semiconductor device according to a second embodiment.

The structure from the semiconductor substrate 30 to the interlayer insulating film 35 shown in FIG. 9A are the same as that shown in FIG. 8A. An insulating film 51 composed of an insulating material is deposited on the interlayer insulating film 35, and a recess 52 that serves as a groove for wiring is formed in the insulating film 51.

Figure 9B:
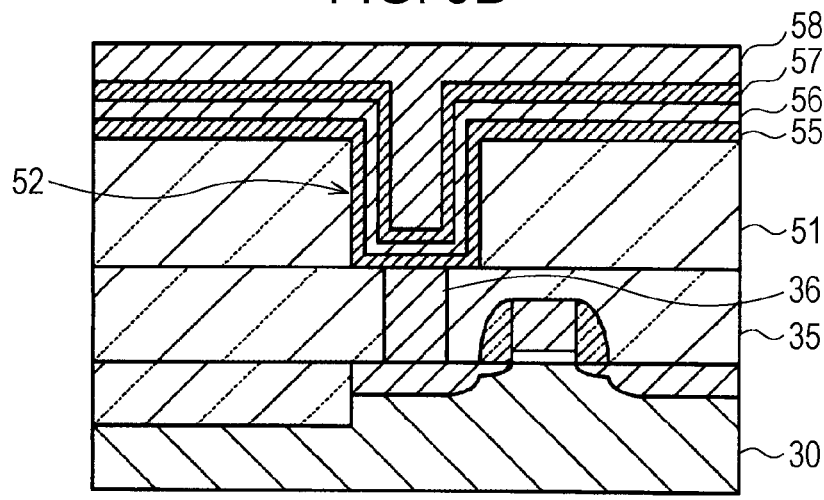

As shown in FIG. 9B, the inner surface of the recess 52 and the upper surface of the insulating film 51 are covered with three coating layers 55, 56, and 57, each of which maybe formed of Ta, TaN, Ti, TiN, Ru, Mn, or the like by sputtering. These coating layers have functions such as preventing diffusion, improving adhesiveness, and the like.

A conductive filler film 58 is deposited on the topmost coating film 57 while filling the interior of the recess 52. The conductive filler film 58 is composed of a conductive material different from any of the materials of the coating films 55, 56, and 57. For example, copper or an alloy containing copper as the main component is used for the conductive filler film 58. The conductive filler film 58 maybe formed by electrolytic plating of copper after formation of a copper seed layer by sputtering.

Figure 9C:
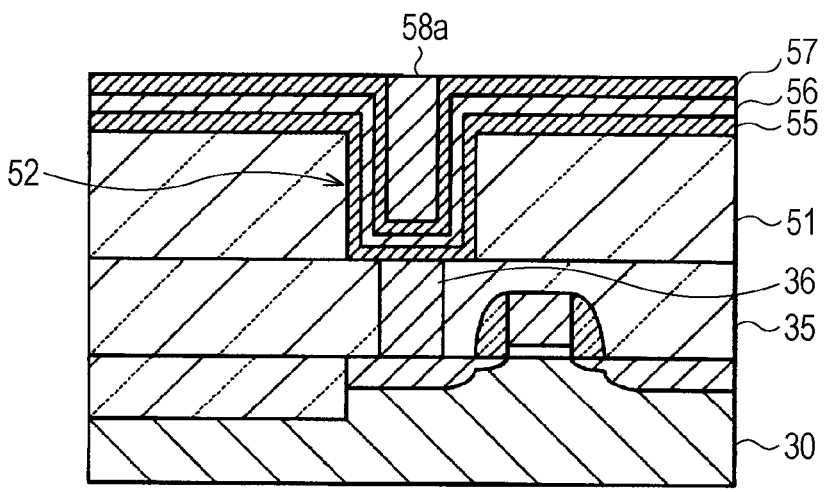

As shown in FIG. 9C, the conductive filler film 58 above the upper surface of the coating film 57 is removed by CMP. As a result, a conductive filler film 58a remains in the recess 52, and the coating film 57 becomes exposed in other regions. Subsequently, the topmost coating film 57 and the surface layer portion of the conductive filler film 58a in the recess 52 is removed by CMP.

Figure 9D:
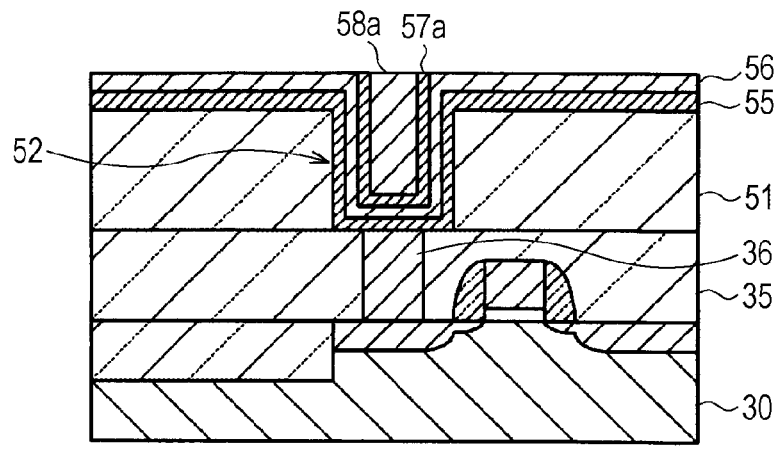

As shown in FIG. 9D, the coating film 57 on the flat surface is removed and the underlying coating film 56 is thereby exposed. The exposed coating film 56 and the surface layer portion of the conductive filler film 58a remaining in the recess 52 are then removed by CMP.

Figure 9E:
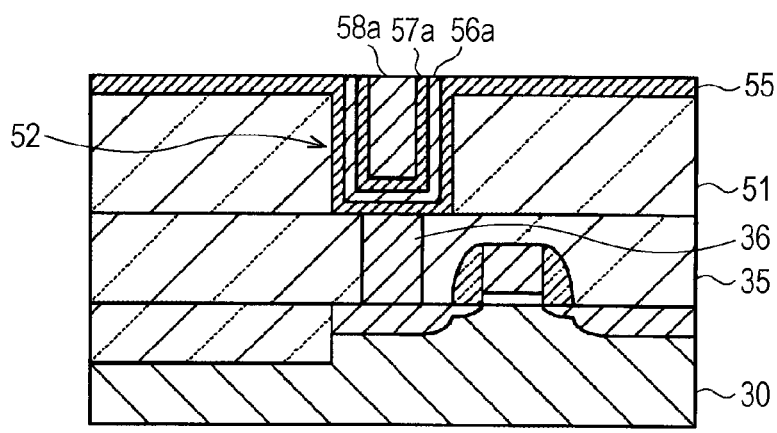

As shown in FIG. 9E, the coating film 56 on the flat surface is removed and the underlying coating film 55 is thereby exposed. The exposed coating film 55 and the surface layer portion of the conductive filler film 58a remaining in the recess 52 are then removed by CMP.

Figure 9F:
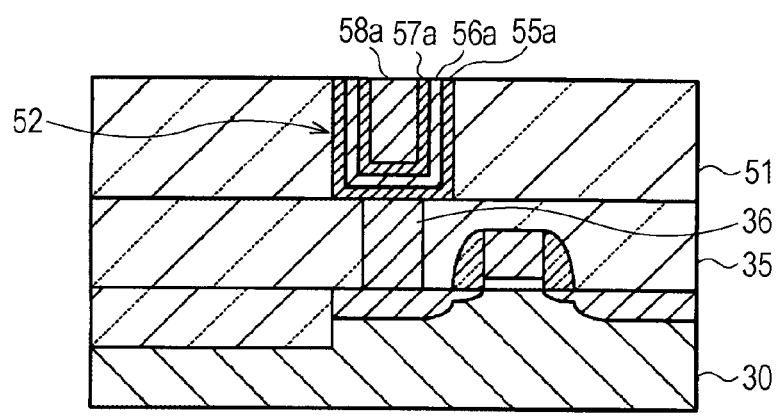

As shown in FIG. 9F, the coating film 56 on the flat surface is removed and the underlying insulating film 51 is thereby exposed. Coating films 55a, 56a, and 57a remain on the inner surface of the recess 52. The conductive filler film 58a filling the recess 52 also remains.

The polishing of the conductive filler film 58 shown in FIG. 9B, the polishing of the coating film 57 shown in FIG. 9C, the polishing of the coating film 56 shown in FIG. 9D, and the polishing of the coating film 55 shown in FIG. 9E are conducted by using polisher pads conditioned with dressers having specifications different from one another. The slurry used is the same.

In polishing the conductive filler film 58 shown in FIG. 9B, it is preferable to adopt a condition under which the polish rate of the conductive filler film 58 is sufficiently larger than the polish rate of the topmost coating film 57.

In the step of polishing the coating film 57 shown in FIG. 9C, the coating film 57 and the conductive filler film 58a in the recess 52 are simultaneously polished. In the step of polishing the coating film 56 shown in FIG. 9D, the coating film 56 and the conductive filler film 58a in the recess 52 are simultaneously polished. In the step of polishing the coating film 55 shown in FIG. 9E, the coating film 55 and the conductive filler film 58a in the recess 52 are simultaneously polished. In order to enhance the flatness of the surface after polishing, it is preferable to bring the ratio of the polish rate between two conductive materials to be polished to be as close to 1 as possible.

Since polisher pads conditioned with dressers with different specifications are respectively used in the CMP steps, the ratio of the polish rate can be adjusted more freely.

For example, a first polisher pad conditioned with a first dresser is used in polishing the conductive filler film 58 shown in FIG. 9B while a second polisher pad conditioned with a second dresser having specifications different from those of the first dresser is used in polishing the coating film 57 shown in FIG. 9C. In polishing the coating film 56 shown in FIG. 9D, a third polisher pad conditioned with a third dresser having specifications different from those of the first and second dressers is used. The first and second dressers are selected so that the ratio of the polish rate of the conductive filler film 58 to the polish rate of the coating film 57 when the first polisher pad is used is larger than when the second polisher pad is used. The second dresser is selected so that the ratio of the polish rate of the conductive filler film 58 to the polish rate of the coating film 57 is closer to 1 than when the first and third polisher pads are used. The third dresser is selected so that the ratio of the polish rate of the conductive filler film 58 to the polish rate of the coating film 56 is closer to 1 than when the first and second polisher pads are used.

A method for fabricating a semiconductor device according to a third embodiment will now be described with reference to FIGS. 10A to 10I.

Figure 10A:
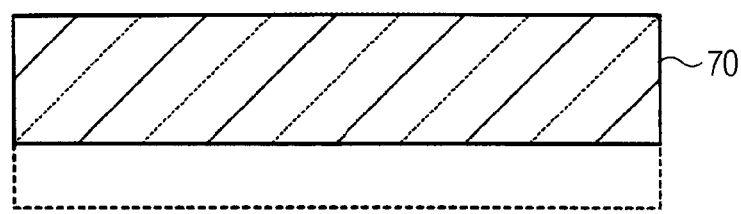
FIGS. 10A to 10I are cross-sectional views of an element illustrating a method for fabricating a semiconductor device according to a third embodiment.

Referring to FIG. 10A, a first insulating film 70 composed of a first insulating material is formed on a substrate with a MOS-FET or the like formed on the surface. This semiconductor substrate has a multilayer structure including the semiconductor substrate 30 and the layers thereon up to the interlayer insulating film 35 shown in FIG. 8A, for example.

Figure 10B:
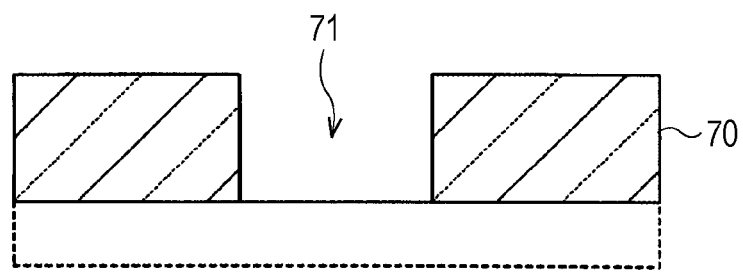
Figure 10C:
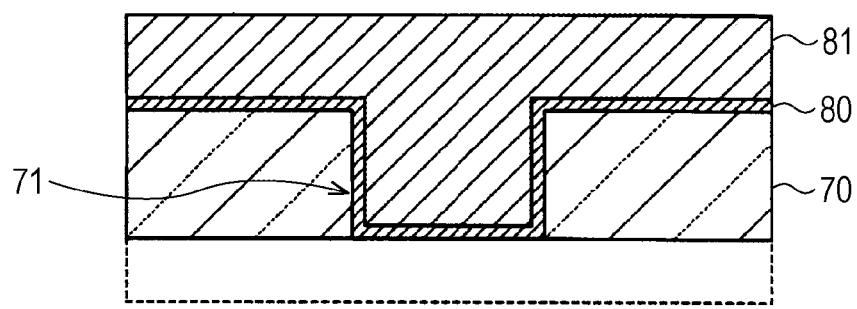

Referring to FIG. 10B, a first recess 71 that serves as a groove for wiring is formed in the first insulating film 70. As shown in FIG. 10C, the inner surface of the first recess 71 and the upper surface of the first insulating film 70 are covered with a coating film 80. A first conductive film 81 is deposited on the coating film 80 while filling the interior of the first recess 71. The coating film 80 maybe composed of Ta, TaN, Ti, TiN, Ru, or Mn, for example. The coating film 80 may be designed to have a multilayer structure including a plurality of films of these metals. Copper or an alloy containing copper as the main component is used in the first conductive film 81.

Figure 10D:
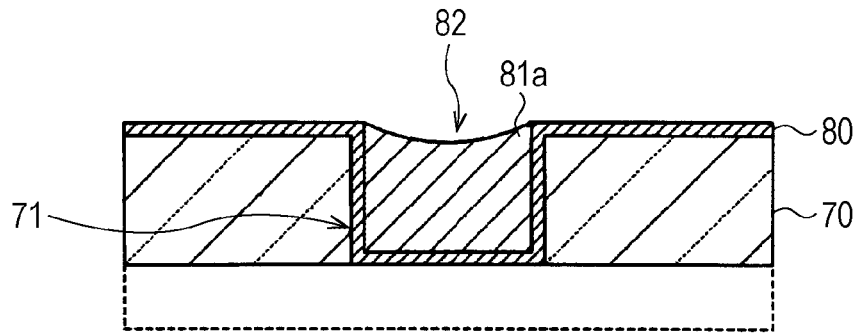

As shown in FIG. 10D, the first conductive film 81 above the upper surface of the first insulating film 70 is removed by CMP. At this stage, the coating film 80 may remain on the flat surface of the first insulating film 70 or the coating film 80 may be removed to expose the upper surface of the first insulating film 70. A coating film 80a covering the inner surface of the first recess 71 remains. A first dishing 82 occurs in the upper surface of a first conductive film 81a remaining in the first recess 71.

Figure 10E:
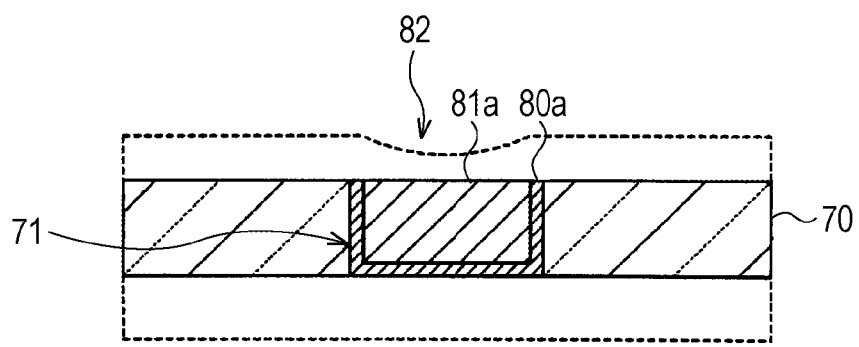

As shown in FIG. 10E, the surface layer portion of the first insulating film 70 and the surface layer portion of the first conductive film 81a remaining in the first recess 71 are removed by CMP to planarize the surface.

In the polishing steps shown in FIGS. 10D and 10E, polisher pads conditioned with dressers having specifications different from each other are used. Compared to the dresser that conditions the polisher pad used in the polishing step shown in FIG. 10D, the dresser that conditions the polisher pad used in the polishing step shown in FIG. 10E may have a large average abrasive grain size, a low abrasive grain arrangement density, or a high ratio of cuboctahedron abrasive grains. The ratio of the polish rate of the first insulating film 70 to the polish rate of the first conductive film 81 can be increased by adequately selecting the polisher pad as such. As a result, the surface flatness of the first insulating film 70 and the first conductive film 81a shown in FIG. 10E can be increased.

Figure 10F:
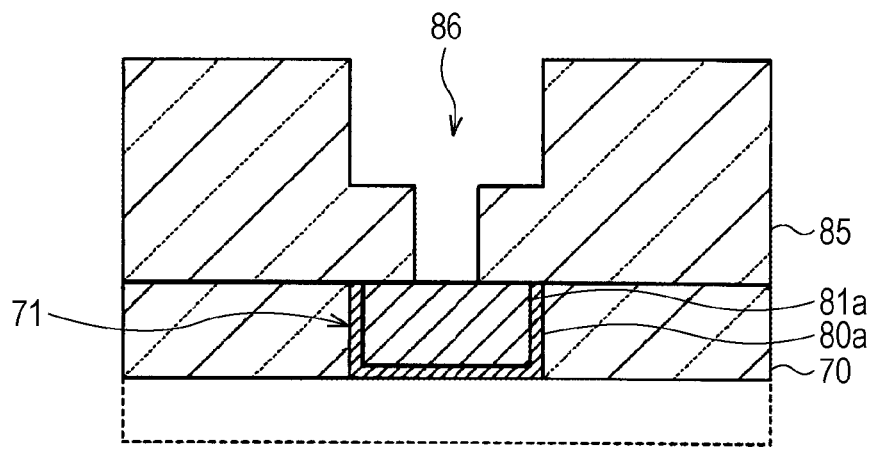

As shown in FIG. 10F, a second insulating film 85 composed of a second insulating material is deposited on the planarized surface. A second recess 86 that serves as a groove for wiring and a via hole for interlayer connection is formed in the second insulating film 85. The first conductive film 81a is exposed at the bottom of the second recess 86.

Figure 10G:
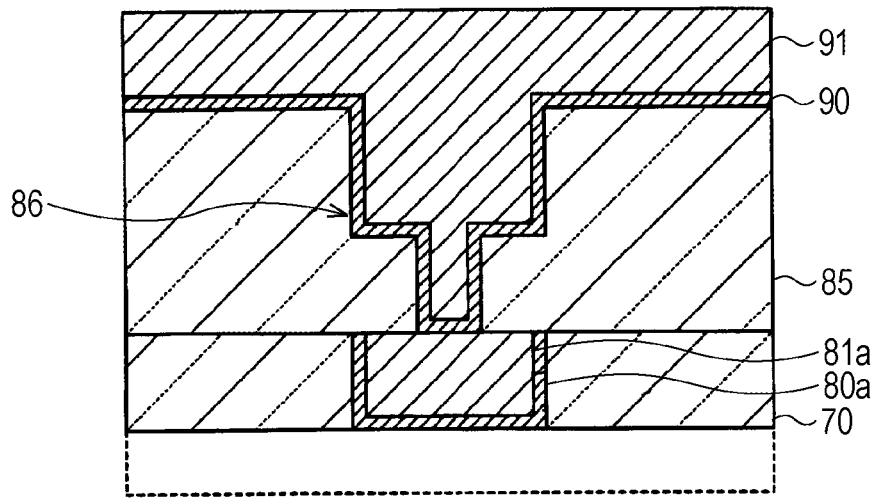

As shown in FIG. 10G, the inner surface of the second recess 86 and the upper surface of the second insulating film 85 are covered with a coating film 90. A second conductive film 91 is deposited on the coating film 90 while the interior of the second recess 86 is filled with the second conductive film 91. The coating film 90 and the second conductive film 91 are formed of the same materials as the coating film 80 and the first conductive film 81 shown in FIG. 10C, respectively.

Figure 10H:
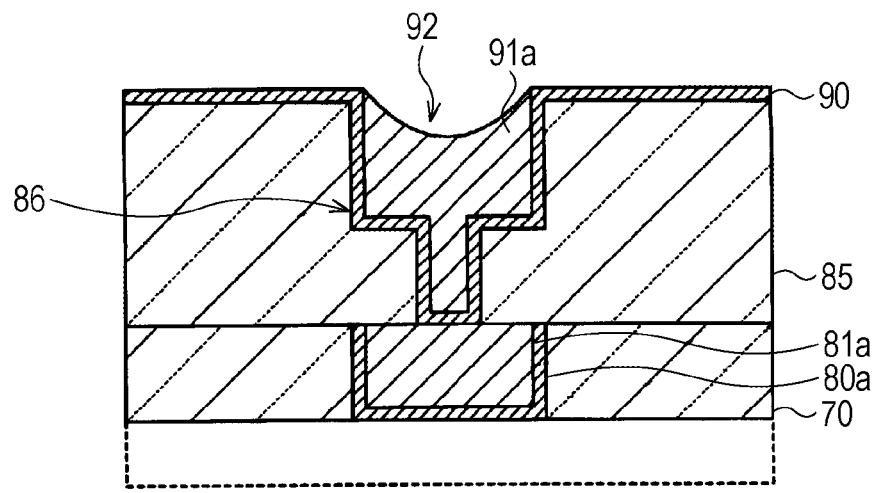

As shown in FIG. 10H, the second conductive film 91 above the upper surface of the second insulating film 85 is removed by CMP. At this stage, the coating film 90 may remain on the flat surface of the second insulating film 85 or the coating film 90 may be removed to expose the upper surface of the second insulating film 85. A second conductive film 91a covering the inner surface of the second recess 86 remains. A second dishing 92 occurs in the upper surface of the second conductive film 91a remaining in the second recess 86.

Figure 10I:
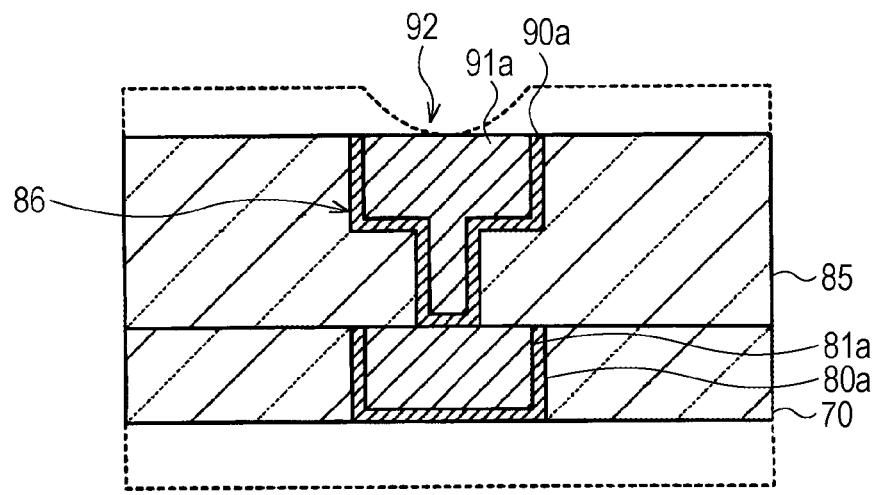

As shown in FIG. 10I, the surface layer portion of the second insulating film 85 and the surface layer portion of the second conductive film 91a remaining in the second recess 86 are removed by CMP to planarize the surface. A multilayer wiring structure (not shown) is then formed on the planarized surface.

In the polishing steps shown in FIGS. 10H and 10I, polisher pads conditioned with dressers having specifications different from each other are used. Compared to the dresser that conditions the polisher pad used in the polishing step shown in FIG. 10H, the dresser that conditions the polisher pad used in the polishing step shown in FIG. 10I may have a large average abrasive grain size, a low abrasive grain arrangement density, or a high ratio of cuboctahedron abrasive grains. The ratio of the polish rate of the second insulating film 85 to the polish rate of the second conductive film 91 can be increased by adequately selecting the polisher pad as such. As a result, the surface flatness of the second insulating film 85 and the second conductive film 91a shown in FIG. 10I can be increased.

The CMP steps shown in FIGS. 10E and FIG. 10I are conducted by using polisher pads conditioned with dressers having specifications different from each other. The slurry used was the same.

In the case where the first dishing 82 is shallower than the second dishing 92, a larger volume of the first conductive film 81a shown in FIG. 10E than the second conductive film 91a shown in FIG. 10I must be removed to planarize the surface. In such a case, dressers for conditioning the polisher pads may be selected so that $(Vc1/Vi1)>(Vc2/Vi2)$ is satisfied where Vi1 is the polish rate of the surface layer portion of the first insulating film 70, Vc1 is the polish rate of the surface layer portion of the first conductive film 81a, Vi2 is the polish rate of the surface layer portion of the second insulating film 85, and Vc2 is the polish rate of the surface layer portion of the second conductive film 91a. On the contrary, in the case where the second dishing 92 is shallower than the first dishing 82, dressers for conditioning the polisher pads may be selected so that $(Vc1/Vi1)<(Vc2/Vi2)$ is satisfied.

The flatness can be enhanced by selecting appropriate dressers as such.

Although FIGS. 3 to 7 show the evaluation results of the cases where $SiO_2$ is used as the insulating material and copper is used as the metal material, it can be assumed that the same tendency is observed for the evaluation results of any other combination of an insulating material and a metal material.

The evaluation results above show that in the case of planarizing a surface with the first dishing 82 and a surface with the second dishing 92, a polisher pad conditioned with a dresser having a relatively large average abrasive grain size is preferably used for planarizing the surface with a deeper dishing. It is also preferable to use a polisher pad conditioned with a dresser having a relatively low abrasive grain arrangement density in planarizing the surface with a deeper dishing. It is also preferable to use a polisher pad conditioned with a dresser having a relatively high ratio of cuboctahedron abrasive grains to planarize the surface with a deeper dishing. It is also preferable to use a polisher pad conditioned with a dresser having abrasive grains arranged at lattice points of a square lattice to planarize the surface with a deeper dishing, and to use a polisher pad conditioned with a dresser having abrasive grains irregularly arranged to planarize the surface with a shallower dishing.

Chemical mechanical polishing employed in the above-described embodiments polishes a surface chemically and mechanically. The ratio of the effects of the chemical action and mechanical action depends on the type of slurry or polishing solution used. There are cases where chemical action is small so that polishing is mainly done by mechanical action. There are other cases where the effect of chemical action is large and the mechanical action is small. In extreme cases, the chemical action is negligibly small and polishing is conducted substantially solely by mechanical actions.

Although the present invention has been described above by way of embodiments, the present invention is not limited to these embodiments. It is apparent for skilled persons that various other modifications, alternations, improvements, and combinations are possible without departing the scope of the present invention.

What is claimed is:

1. A method for fabricating a semiconductor device, comprising:
    (a) forming a first insulating film on a substrate composed of a semiconductor;
    (b) forming a first recess in the first insulating film;
    (c) depositing a first conductive film on the first insulating film while filling the first recess with the first conductive film;
    (d) removing, by polishing, the first conductive film on the first insulating film under a condition that the first conductive film remains in the first recess and a first dishing is formed in an upper surface of the first conductive film remaining in the first recess;
    (e) removing, by polishing, a surface layer portion of the first insulating film and a surface layer portion of the first conductive film remaining in the first recess;
    (f) depositing a second insulating film on the first insulating film and the first conductive film after removing the surface layer portion of the first conductive film;
    (g) forming a second recess in the second insulating film;
    (h) depositing a second conductive film on the second insulating film while filling the second recess with the second conductive film;
    (i) removing, by polishing, the second conductive film on the second insulating film under a condition that the second conductive film remains in the second recess and a second dishing having a depth different from that of the first dishing is formed in an upper surface of the second conductive film remaining in the second recess; and
    (j) removing, by polishing, a surface layer portion of the second insulating film and a surface layer portion of the second conductive film remaining in the second recess, wherein:

in step (e), the surface layer portion of the first conductive film is polished with a first polisher pad conditioned with a first dresser, and, in step (j), the surface layer portion of the second insulating film and the surface layer portion of the second conductive film remaining in the second recess are polished with a second polisher pad conditioned with a second dresser different from the first dresser; and
    the first polisher pad and the second polisher pad are selected to satisfy $(Vc1/Vi1)>(Vc2/Vi2)$ when the first dishing is shallower than the second dishing and $(Vc1/Vi1)<(Vc2/Vi2)$ when the second dishing is shallower than the first dishing, where $Vi1$ is a polish rate of the surface layer portion of the first insulating film, $Vc1$ is a polish rate of the surface layer portion of the first conductive film, $Vi2$ is a polish rate of the surface layer portion of the second insulating film, and $Vc2$ is a polish rate of the surface layer portion of the second conductive film.

2. The method according to claim 1, wherein the first dresser differs from the second dresser in at least one of an average abrasive grain size, an abrasive grain arrangement density, a ratio of cuboctahedron abrasive grains, and arrangement of abrasive grains.

3. The method according to claim 1, wherein a dresser that conditions a polisher pad used for planarizing a surface in which a deeper one of the first dishing and the second dishing is formed has a larger average abrasive grain size, a lower abrasive grain arrangement density, or a higher cuboctahedron abrasive grain ratio than a dresser that conditions a polisher pad used for planarizing a surface in which a shallower one of the first dishing and the second dishing is formed.

4. The method according to claim 1, wherein a dresser that conditions a polisher pad used for planarizing a surface in which a deeper one of the first dishing and the second dishing is formed has abrasive grains arranged at lattice points of a lattice pattern, and a dresser that conditions a polisher pad used for planarizing a surface in which a shallower one of the first dishing and the second dishing is formed has abrasive grains arranged irregularly.

* * * * *